United States Patent [19]

Ikeda et al.

[11] Patent Number: 5,523,383
[45] Date of Patent: Jun. 4, 1996

[54] PHOTOCURABLE RESIN COMPOSITION FOR THE PREPARATION OF A PRINTED WIRING BOARD AND PROCESS FOR THE PREPARATION OF PHOTOCURABLE RESIN

[75] Inventors: Nobuo Ikeda; Teruhisa Kuroki, both of Kawasaki; Tatsuo Yamaguchi, Tokyo; Hiroyoshi Oomiya, Yokohama, all of Japan

[73] Assignee: Nippon Petrochemicals Co., Ltd., Tokyo, Japan

[21] Appl. No.: 240,906

[22] Filed: May 11, 1994

Related U.S. Application Data

[63] Continuation-in-part of Ser. No. 768,063, Sep. 26, 1991, abandoned.

[30] Foreign Application Priority Data

Jan. 30, 1990 [JP] Japan ........................................ 2-17969

[51] Int. Cl.$^6$ ............................. C08G 61/06; C08G 73/10
[52] U.S. Cl. ........................ 528/345; 528/335; 528/336; 525/421; 525/422; 522/149; 522/152; 522/153; 522/158; 522/159; 522/150
[58] Field of Search ............................ 430/287; 522/149, 522/152, 153, 158, 159, 150, 164; 525/419, 420, 420.5, 421, 422; 528/335, 336, 345

[56] References Cited

U.S. PATENT DOCUMENTS

| | | | |
|---|---|---|---|
| 3,974,129 | 8/1976 | De La Mare | 522/149 |
| 4,105,518 | 8/1978 | McGinniss | 522/905 |
| 4,855,215 | 8/1989 | Nakano et al. | 430/283 |
| 5,057,400 | 10/1991 | Yamaguchi et al. | 430/314 |

FOREIGN PATENT DOCUMENTS 0055632  7/1982  European Pat. Off. .

*Primary Examiner*—Susan W. Berman
*Attorney, Agent, or Firm*—Bucknam and Archer

[57] ABSTRACT

A process for the preparation of a photocurable resin which comprises the steps of (I) (a) imidating 20 to 80 mole % of the acid arthydride groups present in an adduct prepared by the addition reaction of an α,β-unsaturated dicarboxylic acid arthydride to a conjugated diene polymer or copolymer with a primary amine to produce water and an amide, (b) reacting the thus formed water as a by-product with at least a part of the remaining acid arthydride groups in said adduct to produce the succinic acid groups by opening the ring of said acid arthydride groups, (II) dehydrating the thus produced succinic acid groups by heating to cause ring closure again thereby forming acid anhydride groups and (III) reacting at least a part, preferably at least 50 mole %, of the acid anhydride rings present in the polymer with an α,β-unsaturated monocarboxylic acid ester having an alcoholic hydroxyl group to conduct a half-esterification by opening the ring of said acid arthydride groups.

9 Claims, No Drawings

PHOTOCURABLE RESIN COMPOSITION FOR THE PREPARATION OF A PRINTED WIRING BOARD AND PROCESS FOR THE PREPARATION OF PHOTOCURABLE RESIN

This application is a continuation-in-part of application Ser. No. 07/768063, filed Sep. 26, 1991, now abandoned.

TECHNICAL FIELD

The present invention relates to a photocurable resin composition, prepared by reacting a specified resin composition prepared by the modification of a conjugated diene polymer or copolymer with both a primary amine having a specific structure and an $\alpha,\beta$-unsaturated monocarboxylic acid ester having a specific structure, and it also relates to a process for the preparation of a photocurable resin to be used in the composition. Particularly, the present invention relates to a photocurable resin composition suitable for use in the preparation of a printed wiring board to be photocured.

BACKGROUND ART

Various processes for the preparation of a printed wiring board have already been developed, among which a process comprising the use of a photocurable and photosensitive resin as an etching resist and a process comprising the use of said resin as a plating resist have recently been employed predominantly.

The former process comprises forming a layer of a photocurable resin composition on a circuit board by some means, adhering a negative-type circuit pattern mask closely to the layer, irradiating actinic rays on the whole to cure desired portions of the layer, removing uncured portions of the layer by development and then etching the resulting board to form a predetermined circuit pattern.

The latter process comprises irradiating a photocurable resin layer formed on a circuit board, with actinic rays through a positive-type pattern mask, removing desired portions of the resin layer by development, plating the desired portions with, e.g., etching-resistant solder, stripping off undesired portions of the resin layer and then etching the resulting board to obtain a predetermined circuit pattern.

The "circuit pattern mask" used in the above processes corresponds to a photographic negative and comprises a light-barrier layer for forming a suitable pattern on a transparent substrate. Although glass may be used as the substrate or base, a plastic film such as polyester film is predominantly used at present. The material of the light-barrier layer is generally chromium, silver or other metal.

The photocurable resin composition used in the above processes generally comprises (1) a binder polymer, (2) a photopolymerizable monomer or oligomer (as a crosslinking agent), (3) a photopolymerization initiator and (4) other components such as a stabilizer, colorant and flame retardant.

The binder polymer serves to shape the resin composition into a film and may mainly be an acrylic polymer which is prepared by the copolymerization of acrylic acid, an acrylate ester, methacrylic acid, a methacrylate ester, styrene etc. and has a molecular weight of several tens of thousands.

The photopolymerizable monomer or oligomer also contains an acryloyl or methacryloyl group. The principle of the above circuit pattern forming process resides in that such a resin composition is used to form a layer and only desired areas of the layer are insolubilized by light exposure.

Although U.S. Pat. No. 3,954,587 discloses a process comprising the use of a specific photocurable composition containing a maleinized oil as a so-called photoresist such as an etching resist, it has been ascertained by the follow-up made by the inventors of the present invention that the resulting coating before irradiation with light is tacky at ordinary temperatures as examined according to the tack test, because the composition used in said Patent comprises a maleinized oil and an ethylenically unsaturated compound having at least two unsaturated bonds in the molecule.

In the conventional production of a printed wiring board, a circuit pattern mask is adhered in a vacuum closely to a photosensitive coating formed on a substrate, and the whole is then exposed to UV. If the photosensitive resin coating is tacky at ordinary temperatures, the coating will partially remain adhered to the mask when the mask is attempted to be peeled off the coating after the exposure. Although this adhesion can be prevented by using a cooling apparatus or bath after the exposure step, this means will increase the equipment cost, necessitate one additional step and make the operation troublesome unfavorably. Meanwhile, the application of a release agent or the like to the circuit pattern mask will exert adverse effects on the formation of a fine pattern. Under these circumstances, the inventors of the present invention have reported in Japanese Patent Application Laid-Open Gazette No. 138371/1990 which corresponds to U.S. Pat. No. 5,057,400 that a photosensitive resin coating made from a modified resin prepared by adding an $\alpha,\beta$-unsaturated dicarboxylic acid anhydride to a conjugated diene polymer or copolymer to form an adduct having a softening point of 70° to 200° C. (as determined by the ring and ball softening point method according to JIS K 2531-60) and reacting the adduct with an $\alpha,\beta$-unsaturated mono- or di-carboxylic acid ester having an alcoholic hydroxy group to open a part or the entire acid anhydride rings and introduce conjugated double bonds into the adduct, is a little tacky at ordinary temperatures as examined according to the tack test.

In the practical production of a printed wiring board, the extent of adhesion of a photosensitive coating remaining adhered to a circuit pattern mask after the step of peeling the mask from the coating varies depending upon various conditions such as temperature, pressure and time. In any case, a higher temperature, a higher pressure or a longer time will cause the coating to remain adhered to the mask more easily after the removal of the mask. For example, because the practical production of a printed wiring board is conducted continuously, the temperature of the atmosphere itself is liable to rise by the heat dissipation of a light source. Further, the vacuum adhesion of the mask to the photosensitive coating applies a pressure to a substrate for the board. These phenomena are causative of more liability of the coating to remain adhered to the mask.

Therefore, the inventors of the present invention tested the photosensitive coating of Japanese Patent Application Laid-Open Gazette No. 138371/1990 which corresponds to U.S. Pat. No. 5,057,400 for its adhesion to a pattern mask after the step of peeling the mask under approximately the same conditions as those for the practical production with the result that the coating of said application was found to be not always satisfactory.

In the above test, a distinct peel noise was not heard when the pattern mask was peeled off the coating after light exposure, which means that the coating was not completely tack-free. When the photosensitive resin coating is not completely tack-free, during the repeated use of the pattern mask, which is expensive, in the industrial production of circuit boards, the resin will cumulatively adhere to the peeled mask, which makes further use of the mask impossible or gives a deficient or shortcircuit resist pattern at the worst.

Further, the photosensitive coating formed on a substrate for a wiring board must have a measure of hardness. This is because the steps of producing a printed wiring board are carried out one after another on a conveyor line, that is, a substrate having a photosensitive resin coating formed thereon is transferred to a light exposure step through the conveyor line, during which the coating is liable to be damaged in a case where it is soft. The photosensitive resin coating made from the previously mentioned modified resin has insufficient hardness.

DISCLOSURE OF THE INVENTION

An object of the present invention is to provide a composition which can give a substantially tack-free photosensitive coating photosensitive coating having a sufficiently high hardness.

This object is achieved by providing a photocurable resin composition comprising (a) 100 parts by weight of a conjugated diene polymer or copolymer having functional groups respectively represented by the following formulas (I) and (II), a number average molecular weight of 500 to 5000 and a vinyl content of 50 mole % or above:

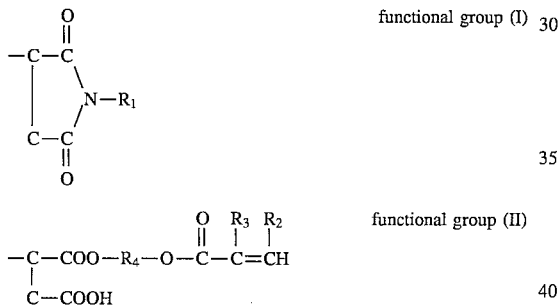

wherein $R_1$ represents a hydrocarbon residue having 1 to 20 carbon atoms which is unsubstituted or substituted by an amino group; $R_2$ and $R_3$ each represent a hydrogen atom or a methyl group; and $R_4$ represents a hydrocarbon residue or alkylene oxide derived group having 2 to 20 carbon atoms which is unsubstituted or substituted by a phenoxy group, and (b) 0.1 to 20 parts by weight of a photopolymerization initiator.

Another object of the present invention is to provide a process for the preparation of a photocurable resin which comprises imidating 20 to 80 mole % of the acid anhydride groups present in an adduct prepared by the addition reaction of an α,β-unsaturated dicarboxylic acid anhydride and a conjugated diene polymer or copolymer having a number average molecular weight of 500 to 5000 and a vinyl content of 50 mole % or above with a primary amine represented by the following general formula (III), dehydrating the succinic acid groups formed by ring breakage of the remaining acid anhydride groups with the water generated as a by-product by the imitation to cause ring closure again thereby forming acid anhydride groups and then reacting the resulting polymer with an α,β-unsaturated monocarboxylic acid ester having an alcoholic hydroxyl group represented by the following general formula (IV) to open at least a part of the acid anhydride rings present in the polymer:

general formula (III)

  (III)

wherein $R_1$ represents a hydrocarbon residue having 1 to 20 carbon atoms which is unsubstituted or substituted by an amino group;

general formula (IV)

wherein $R_2$ and $R_3$ each represent a hydrogen atom or a methyl group; and $R_4$ represents a hydrocarbon residue or alkylene oxide derived group having 2 to 20 carbon atoms which is unsubstituted or substituted by a phenoxy group.

BEST MODE FOR CARRYING OUT THE INVENTION

The present invention will now be described in more detail.

The conjugated diene polymer or copolymer to be used in the resin composition of the present invention is a lower polymer of a conjugated diolefin having 4 or 5 carbon atoms, such as butadiene or isoprene, or a copolymer of low degree of polymerization comprising one or more of these conjugated diolefins and an ethylenically unsaturated monomer other than the conjugated diolefins, said monomer being particularly selected from among aliphatic and aromatic monomers such as isobutylene, diisobutylene, styrene, α-amethylstyrene, vinyltoluene and divlnyltoluene. Alternatively, a mixture of two or more of the polymers and the copolymers may be used.

The above conjugated diene polymer or copolymer is one having a vinyl content of 50 mole % or above and a number average molecular weight ranging from 500 to 5000. A conjugated diene polymer or copolymer having a vinyl content of less than 50 mole % will give too low a crosslinking density unfavorably. Further, a conjugated diene polymer or copolymer having a number average molecular weight of less than 500 will give a photosensitive coating poor in strength, while one having a number average molecular weight exceeding 5000 will not give any smooth coating unfavorably.

The preparation of the above modified resin can be conducted as follow.

The conjugated dicne polymer or copolymer can be prepared by conventional processes. Typical one of these processes comprises anionically polymerizing one or more conjugated diolefins having 4 or 5 carbon atoms preferably together with an aromatic vinyl monomer such as styrene, α-methylstyrene, vinyltoluene or divinyltoluene in an amount of at most 50 mole % based on the conjugated diolefins in the presence of an alkali metal or organoalkali metal compound as a catalyst at a temperature of 0°to 100° C. In this case, to obtain a light-colored polymer or copolymer having a controlled molecular weight and a lowered gel fraction is desired, it is suitable to employ a chain transfer polymerization process using an organoalkali metal compound such as benzyl sodium and a compound having an alkylaryl group such as toluene as a chain transfer agent (see U.S. Pat. No. 3,789,090), a living polymerization process which comprises conducting the polymerization in tetrahydrofuran as a solvent in the presence of a polycyclic aromatic compound such as naphthalene as an activator and an alkali metal catalyst such as sodium, or a process characterized by modifying the molecular weight by the use of an aromatic hydrocarbon such as toluene or xylene as a solvent and a dispersion of a metal such as sodium as a catalyst and the addition of an ether such as dioxane. Further, there may be used a lower polymer prepared by the coordination anionic polymerization using an acetylacetonate of a Group VIII metal of the periodic table, such as cobalt or nickel, or an alkylaluminum halide as a catalyst.

Then, the conjugated diene polymer or copolymer is addition reacted with an α,β-unsaturated dicarboxylic acid arthydride to form an adduct.

The α,β-unsaturated dicarboxylic acid anhydride to be used in the present invention includes maleic anhydride, citraconic anhydride and chloromaleic anhydride.

Generally, the above addition reaction is conducted at a temperature of 100°to 250° C. in an inert solvent in which either the (co)polymer or the anhydride or both of them are soluble. In this addition reaction, 0.1 to 0.3 part by weight of hydroquinone, catechol or a p-phenylenediamine derivative is used as an antigelling agent.

According to the present invention, the addition of an α,β-unsaturated dicarboxylic acid arthydride must be conducted so as to give an adduct having a softening point ranging from 70°to 200° C. (as determined by the ring and ball softening point method according to JIS K 2531-60). If the softening point is lower than 70°° C, the resulting coating will be tacky, while if it exceeds 200° C, no smooth coating will be formed unfavorably. The softening point varies mainly depending upon the unsaturated bond content and molecular weight of the conjugated diene polymer or copolymer used as the raw material and the amount of the α,β-unsaturated dicarboxylic acid anhydride added to the (co)polymer. For example, when a liquid polybutadiene having a number average molecular weight of 1,000 is used, an adduct obtained must have a total acid number of 400 mgKOH/g or above. Generally, however, the softening point of the adduct can be controlled in the above range by addition reacting the (co)polymer with an α,β-unsaturated dicarboxylic acid arthydride so as to give an adduct having a half acid number of 50 to 450 mgKOH/g, preferably 100 to 400 mgKOH/g.

The adduct thus prepared is imidated with a primary amine represented by the general formula (III) in an amount of 20 to 80 mole % based on the acid anhydride groups. In this imitation, a small amount of the amine is bonded to the adduct through amide linkages by a side reaction in some cases:

general formula $$H_2N-R_1 \quad\quad (III)$$

wherein $R_1$ represents a hydrocarbon residue having 1 to 20 carbon atoms which is unsubstituted or substituted by an amino group. The above imidation proceeds as follows:

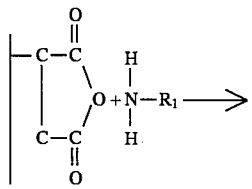

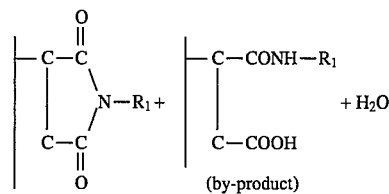

wherein $R_1$ is as defined above and in the reaction formula, the molar ratio among the compounds is not specified.

In the above general formula (III), $R_1$ represents a hydrocarbon residue having 1 to 20 carbon atoms which is unsubstituted or substituted by an amino group and examples of the residue include propyl, butyl, phenyl, hydroxyphenyl, benzyl and dimethyl aminopropyl groups. Examples of the amine of the general formula (III) include N-propylamine, N-butylamine, N-sec-butylamine, aniline, benzylamine and N,N-dimethyl aminopropylamine.

The above imidation is conducted at a temperature of 100°to 300° C., preferably 150° to 200 ° C.

The amount of the primary amine introduced in the imidation must be 20 to 80 mol % based on acid anhydride groups present in the resin. If the amount is less than 20 mole %, the resulting coating will be tacky and will be insufficiently improved in pencil hardness while if it exceeds 80 mole %, the photosensitivity of the resulting coating will be poor.

Generally, the imidation is conducted in a solvent which is inert to the adduct and the primary amine and can dissolve both of them therein. Examples of such a solvent include aromatic hydrocarbons such as toluene and xylene; ketones such as methyl ethyl ketone and methyl isobutyl ketone; esters such as ethyl acetate; and ethers free from hydroxyl group such as diethylene glycol dimethyl ether and triethylene glycol dimethyl ether.

In the imidation, water is generated as a of condensation reaction to open a part of the acid anhydride rings present in the resin thereby forming succinic acid groups, but the succinic acid groups thus formed can be easily dehydrated by heating to form acid arthydride groups again as shown by the reaction formula which will be given below. It is desirable that all of the succinic acid groups be converted into acid anhydride groups. The temperature and time of the heating may be suitably selected. In the dehydration, the removal of the generated water from the system may be accelerated by blowing an inert gas into the system. The dehydration is preferably conducted simultaneously with the imidation, though it may be, of course, conducted separately from the imidation. The completion of the reaction can be ascertained based on the acid value of the reaction mixture and by IR analysis.

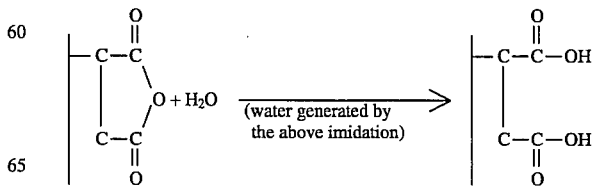

-continued

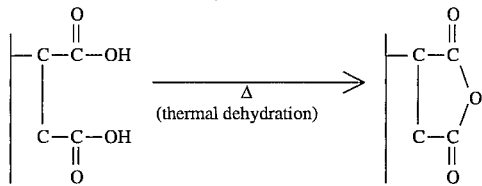

According to the present invention, at least a part preferably at least 50 mole %, of the acid anhydride rings remaining in the imidated adduct are opened with an α,β-unsaturated monocarboxylic acid ester having an alcoholic hydroxyl group as shown by the reaction formula which will be given below in this ring-opening or ring breakage reaction, the functional group (I) which has been formed by the imidation described above does not change so far as the reaction is conducted under general reaction conditions.

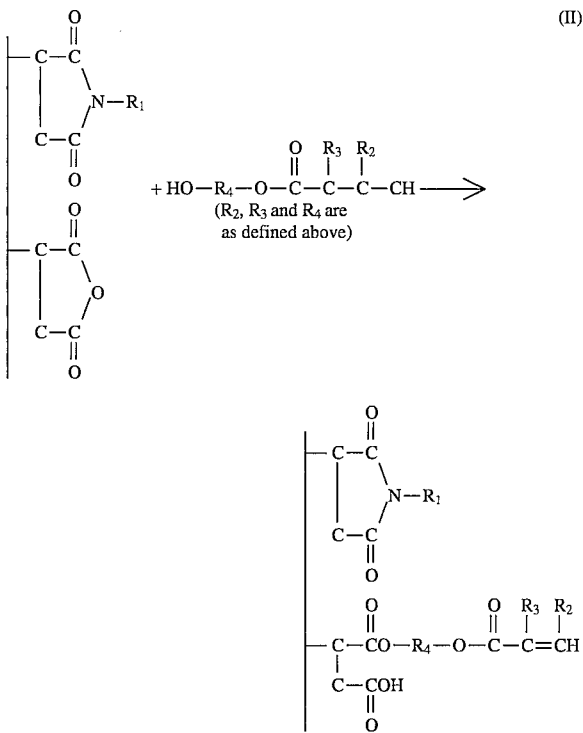

Examples of the α,β-unsaturated monocarboxylic acid ester having an alcoholic hydroxyl group represented by the above general formula (II) include 2-hydroxyethyl acrylate, 2-hydroxyethyl methacrylate, 2-hydroxypropyl acrylate, 2-hydroxypropyl methacrylate, N-methylolacrylamide, 2-hydroxy-3-phenoxypropyl acrylate and 2-hydroxy-3-phenoxypropyl methacrylate, methacrylic acid diethylene glycol monoester, acrylic acid diethylene glycol monoester, methacrylic acid dipropylene glycol monoester, acrylic acid dipropylene glycol monoester, which may be used singly or jointly. The above acrylates or methacrylates are monoester compounds of acrylic or methacrylic acid with glycols such as ethylene glycol, phenoxyethylene glycol, propylene glycol, phenoxypropylene glycol, diethylene glycol, dipropylene glycol, triethylene glycol and tripropylene glycol. These glycols have 2 to 20 carbon atoms, preferably 2 to 10 carbon atoms. When glycols having more than 20 carbon atoms are used, the photocurable resin composition is more tacky and its softening point becomes lower.

The ring breakage reaction of the acid anhydride groups is generally conducted in the presence of a base catalyst at a relatively low temperature of 100° C. or below. It is preferable to use a solvent which is inert to the unsaturated monocarboxylic acid ester and the imide resin and can dissolve both of them therein in the ring breakage reaction. Examples of such a solvent include aromatic hydrocarbons such as toluene and xylene; ketones such as methyl ethyl ketone and methyl isobutyl ketone; esters such as ethyl acetate; ethers free from hydroxyl group such as diethylene glycol dimethyl ether and triethylene glycol dimethyl either; and tertiary alcohols such as diacetone alcohol.

It is necessary from the standpoint of photosensitivity that the ratio of the acid anhydride rings opened or broken with an α,β-unsaturated monocarboxylic acid ester having an alcoholic hydroxyl group be 50 mole % or above based on the entire acid anhydride groups remaining after the imidation, if the ratio is less than 50 mole %, the photocurability necessary for the formation of a circuit pattern will not substantially be obtained.

According to the present invention, the amounts of the functional groups (I) and (II) addition reacted with the conjugated diene polymer or copolymer are as follows.

First, an unsaturated dicarboxylic acid anhydride is addition reacted with the conjugated diene polymer or copolymer in such an amount as to give an adduct having a half acid number of 50 to 450 mgKOH/g, preferably 100 to 400 mgKOH/g.

Then, 20 to 80 mole % of the acid anhydride groups thus addition reacted are imidated, which means that the functional groups (I) are addition reacted with the conjugated diene polymer or copolymer in an amount of 20 to 80 mole %, based on the acid anhydride groups addition reacted with the (co)polymer.

On the other hand, at least 50 mole %, of the acid anhydride remaining without being imidated are subjected to ring breakage, ring closure through dehydration and again ring breakage successively, which means that the functional groups (II) are addition reacted with the copolymer in an amount of at least 50 mole & based on the acid anhydride groups remaining after the imidation.

Thus, the modified resin (a) according to the present invention is prepared.

The photopolymerization initiator (b) to be used in the present invention may be any conventional one and includes not only benzoyl, benzoin methyl ether, benzoin methyl ether, benzoin isobutyl ether, benzil, Michler's ketone and 2,4-diethylthioxanthone but also compounds commercially available under the trade name of Irgacures 184, 651 and 907 (products of Ciba-Geigy) and Darocure 1173 (a product of Merck & Co.), which may be used singly or jointly. The photopolymerization initiator is used in an amount of 0.1 to 20 parts by weight per 100 parts by weight of the modified resin (a). IF the amount is less than 0.1 part by weight, the photocurability of the resulting composition will, be unfavorably low, while if it exceeds 20 parts by weight, the strength of the resulting photosensitive coating will be lowered unfavorably.

An arbitrary third component may be added to the composition of the present invention in such a range as not to make the coating tacky. The third component includes photopolymerizable monomers such as trimethylolpropane triacrylate and pentaerythritol triacrylate aminoacrylate; epoxyacrylate resin; wax; and special imide compounds.

The photocurable resin composition of the present invention comprising the modified resin (a) and the photopolymerization initiator (b) may be coated with a roll coater or an applicator in the form of a so-called varnish prepared by dissolving it in a suitable solvent or may be electrodeposited in the form of an aqueous solution or dispersion.

When the composition is applied by electrodeposition, it is suitable to neutralize at least 10 % of the carboxyl groups present in the modified resin (a) with a conventional base to thereby make the resin soluble or dispersible in water. When the extent of neutralization is too low, the resulting composition will be poor in water solubility or dispersibility, thus being unfit for water-based coating material. The base to be used in the neutralization includes ammonia; amines such as diethylamine, triethylamine, monoethanolamine, diethanolamine. N,N-dimethylethanolamine and N,N-dimethylbenzylamine; and potassium hydroxide. If necessary, various organic solvents may be added to the composition for the purpose of improving the water solubility or dispersibility of the composition or controlling the flowability of the coating. Examples of such organic solvents include water-soluble ones such as ethyl Cellosolve, butyl Cellosolve, ethylene glycol dimethyl ether, diacetone alcohol, 4-methoxy-4-methylpentanone-2 and methyl ethyl ketone; and nonaqueous ones such as xylene, toluene, methyl isobutyl ketone and 2-ethylhexanol.

The composition for electrodeposition coating prepared by the neutralization described above is a water-based one and is apparently therefore advantageous in respect of safeness and production.

The photocurable resin composition of the present invention may suitably contain a conventional heat polymerization stabilizer such as hydroquinone, 2,6-di-t-butyl-p-cresol, p-benzoquinone, hydroquinone monomethyl ether,phenothiazine or α-naphthylamine.

Although the photocurable resin composition of the present invention can De applied to an arbitrary substrate, the case of applying it to copper-clad laminate will be described as an example.

The application of the composition according to the present invention to a copper-clad laminate may be conducted either by a conventional dip, roll or curtain coating method or by converting the composition into a water-based coating material according to a conventional process and electrodepositing the water-based coating material. The drying is conducted generally at 120° C. or below, preferably at 100° C. or below, for 5 to 20 minutes. When the drying temperature exceeds 120° C., the coating will be heat-cured unfavorably.

The coating thus formed is a tack-free one having a smooth surface which is very useful as a photosensitive coating for the formation of a circuit pattern.

The photosensitive coating formed on a copper-clad laminate is exposed to an actinic radiation such as ultraviolet rays through a negative mask to cure exposed portions of the coating.

Although the actinic radiation to be favorably used in the curing of the coating varies depending upon the absorption wavelength of the photopolymerization initiator, it is generally ultraviolet rays emitted from xenon lamps, metal halide lamps, low-, medium-, high- or ultra-high-pressure mercury vapor lamps, or electron beams or α-, β- or γ-rays emitted from an electron accelerator. The luminous intensity of a light source and the irradiation time may be suitably selected. Further, the irradiation may be conducted either in the open air or in an inert atmosphere such as nitrogen.

After the irradiation, the coating-covered substrate is subjected to development with a suitable developer by which unexposed portions of the coating are dissolved, thereby to bring the conductive film in a circuit pattern. The conductive film is removed with an etching agent, followed by the removal of the cured coating with a suitable release agent. Thus, a wiring pattern of extremely high resolution can be obtained. However, an acid group (carboxyl group) of more than the predetermined amount is always contained in the photocurable composition of the present invention since the remaining acid anhydride groups in the adduct are half-esterified. By virtue of the existence of the acid group, in a case where the photocurable composition of the present invention is used as a photoresist, it is advantageous in the development after the photocuring since the alkali development can easily be conducted by means of an alkaline developer. After the development, the remaining coating may be post-cured by the irradiation with UV rays or at a temperature of 120° C. or above to thereby improve the resistance of the coating to etching.

According to the present invention, a photosensitive coating which is substantially tack-free even when used in practical light exposure equipment and has a sufficiently high hardness can be obtained. Thus, the photocurable coinposition of the present invention is suitable for the preparation of a printed wiring board of a photosensitive type.

PREFERRED EXAMPLES OF THE INVENTION

The present invention will now be described in more detail by referring to the following Examples and so on, though the present invention is not limited to them.

Resin Preparation 1

322 g of a liquid butadiene polymer prepared by polymerizing butadiene at 30° C. in the presence of benzyl sodium as a catalyst and toluene as a chain transfer agent and having a number average molecular weight of 1,000, a viscosity of 14 poise at 25° C. and a 1,2-bond content of 65%, 4, 245 g of maleic anhydride, 10 g of xylene and 1.1 g of Antigert 6C (a product of Sumitomo Chemical Co., Ltd., trade name) were fed into a 1-l separable flask fitted with a reflux condenser and a nitrogen gas inlet tube and reacted together at 190° C. in a stream of nitrogen for 4.5 hours. The unreacted maleic anhydride and the xylene were distilled off to obtain a maleilized butadiene polymer having a total acid number of 480 mgKOH/g. The polymer had a softening point of 128° C. (as determined by the ring and ball softening point according to JIS K 2531- 60).

200 g of the above maleinized butadiene polymer, 180 g of triethylene glycol dimethyl ether and 0.2 g of hydroquinone were introduced into a 1-l separable flask fitted with a reflux condenser and a nitrogen/air inlet tube. The flask so changed was immersed in an oil bath at 150° C. and the contents were mildly stirred to dissolve the polymer completely.

27.5 g of benzylamine was added into the flask and the resulting mixture was stirred at 160° C. for one hour to effect amidation. While blowing nitrogen into the reaction mixture through the inlet tube, the contents were stirred at that temperature for 5 hours to complete the imidation. The completion of the imidation was ascertained based on acid value of the reaction mixture and by IR analysis.

85.6 g of 2-hydroxypropyl acrylate, 18.2 g of triethylamine and 89 g of diacetone alcohol were added to the reaction mixture. While blowing air into the obtained mixture, the mixture was stirred at 70° C. for 6 hours to give a resin A. The completion of the reaction was ascertained by the disappearance of the acid anhydride groups according to IR analysis.

The nonvolatile content of the resin A was 48 % and the acid value thereof was 125 mgKOH/g of resin.

Resin Preparation 2

200 g of the maleinized butadiene polymer prepared in the Resin Preparation 1, 180 g of triethylene glycol dimethyl ether and 0.2 g of hydroquinone were fed into a 1-1 separable flask fitted with a reflux condenser and an air inlet tube. The flask so charged was immersed in an oil bath at 150° C. and the contents were mildly stirred to dissolve the polymer completely. 27.5 g of benzylamine was added into the flask and the resulting mixture was stirred at 160° C. for one hour to effect amidation. While blowing nitrogen into the reaction mixture through the inlet tube, the contents were stirred at that temperature for 5 hours to complete the imidation. The completion of the imidation was ascertained based on the acid value of the reaction mixture.

61.2 g of 2-hydroxypropyl acrylate, 13 g of triethylamine and 86 g of diacetone alcohol were added to the reaction mixture. While blowing air into the obtained mixture, the mixture was stirred at 70° C. for 6 hours to give a resin B. The completion of the reaction was ascertained by disappearance of the acid anhydride groups according to IR analysis.

The nonvolatile content of the resin B was 49 & and the acid value the acid value thereof was 92 mgKOH/g of resin.

Resin Preparation 3

200 g of the maleinized butadiene polymer prepared in the Resin Preparation 1, 180 g of diacetone alcohol and 0.2 g of hydroquinone were fed into a 1-1 separable flask fitted with a reflux condenser and an air inlet tube. The flask so Fed was immersed in an oil bath at 80° C. and the contents were mildly stirred to dissolve the polymer completely.

While blowing air into the reaction mixture little by little through the inlet tube, 117.6 g of 2-hydroxypropyl acrylate and 16 g of triethylamine were added to the flask to make the contents react at 70° C. for 6 hours. Thus, a resin C was obtained.

The nonvolatile content of the resin C was 57 % and the acid value thereof was 178 mgKOH/g of resin.

Example 1

Irgacure 907 (a product of Ciba-Geigy) as a photopolymerization initiator and 2,4-diethylthioxanthone were added to the resin A prepared in the Resin Preparation 1 in amounts of 7.2 and 0.8% by weight based on the solid resin content, respectively. The obtained mixture was stirred at 40° C. or below for one hour while being shielded from the light. Thus, a photocurable resin composition was prepared.

This composition was applied to a copper-clad laminate which had preliminarily been brushed, cleaned and degreased, with an applicator and then dried at 80° C. for 20 minutes to give a coating having a thickness of 15 μm.

The coating was subjected to a tack test, photosensitivity test and pencil hardness test which will be described below. The results are given in Table 1.

Example 2

Irgacure 907 (a product of Ciba-Geigy) as a photopolymerization initiator and 2,4-diethylthioxanthone were added to the resin A prepared in the Resin Preparation 1 in amounts of 7.2 and 0.8% by weight based on the solid resin content, respectively. Triethylamine was added to the obtained mixture in such an amount as to neutralize one-third of the acid groups present in the resin. The resulting mixture was dispersed in water according to a conventional process to give a photocurable composition for electrodeposition coating. This composition had a nonvolatile content of 15%, a pH of 7.1 and an electrical conductivity of 0.90 mS/cm.

This composition was electrodeposited on a copper-clad laminate which had preliminarily been brushed, cleaned and degreased, under the conditions which will be described below, drained and then dried at 100° C. for 5 minutes to give a coating having a thickness of 15 μm.

This coating was subjected to a tack test, photosensitivity test and pencil hardness test which will be described below. The results are given in Table 1.

(electrodeposition conditions)

electrodeposition method: anionic deposition, constant current method: 90 to 110 mA/dm$^2$ for 3 min.

Example 3

Irgacure 651 (a product of Ciba-Geigy) as a photopolymerization initiator was added to the resin B prepared in the Resin Preparation 2 in an amount of 8.0% by weight based on the solid resin content. The obtained mixture was stirred at 40° C. or below for one hour, while being shielded from the light. Thus, a photocurable resin composition was obtained.

This composition was applied to a copper-clad laminate which had preliminarily been brushed, cleaned and degreased, with an applicator and then dried at 80° C. for 20 minutes to give a coating having a thickness of 15 μm.

The coating was subjected to a tack test, photosensitivity test and pencil hardness test which will be described below. The results are given in Table 1.

Example 4

Triacryloyloxyethyl isocyanurate (a product of Toagosei Chemical Industry Co., Ltd.; trade name: Aronix M 315), Irgacure 907-(a product of Ciba-Geigy) as a photopolymerization initiator and 2,4-diethylthioxanthone were added to the resin B prepared in the Resin Preparation 2 in amounts of 5, 7.2 and 0.8% by weight based on the solid resin content, respectively. Triethylamine was added to the obtained mixture in such an amount as to neutralize a half of the acid groups present in the resin. The resulting mixture was dispersed in water according to a conventional process to give a photocurable composition for electrodeposition coating. This composition had a nonvolatile content of 15%, a pit of 8.1 and an electrical conductivity of 1.10 mS/cm.

This composition was electrodeposited on a copper-clad laminate which had preliminarily been brushed, cleaned and degreased, under the same conditions as those employed in Example 2, drained and then dried at 100° C. for 5 minutes to give a coating having a thickness of 15 μm.

This coating was subjected to a tack test, photosensitivity test and pencil hardness test which will be described below. The results are given in Table 1.

Comparative Example 1

Irgacure 907 (a product of Ciba-Geigy) as a photopolymerization initiator and 2,4-diethylthioxanthone were added to the resin C. prepared in the Resin Preparation 3 in amounts of 7.2 and 0.8 parts by weight based on the solid resin content, respectively. The obtained mixture was stirred at 40° C. or below for one hour, while being shielded from the light. Thus, a photocurable resin composition was obtained.

The composition was applied to a copper-clad laminate which had preliminarily been brushed, cleaned and degreased, with an applicator and then dried at 80° C. for 20 minutes to give a coating having a thickness of 15 μm.

The coating was subjected to a tack test, photosensitivity test and pencil hardness test which will be described below. The results are given in Table 1.

Comparative Example 2

Irgaeure 907 (a product of Ciba-Geigy) as a photopolymerization initiator was added to the resin C prepared in the Resin Preparation 8 in an amount of 8.0% by weight based on the solid resin content. Triethylamine was added to the obtained mixture in such an amount as to neutralize one-third of the acid groups present in the resin. The resulting mixture was dispersed in water according to a conventional process to give a photocurable composition for electrodeposition coating. This composition had a nonvolatile content of 15 %, a pH of 6.6 and an electrical conductivity of 1.80 mS/cm. The composition was electrodeposited on a copper-clad laminate which had preliminarlly been brushed, cleaned and degreased, under the same conditions as those employed in Example 2, drained and then dried at 100° C. for 5 minutes to give a coating having a thickness of 15 μm.

This coating was subjected to a tack test, photosensitivity test and pencil hardness test which will be described below. The results are given in Table 1.

TABLE 1

|  |  | Ex. 1 | Ex. 2 | Ex. 3 | Ex. 4 | Comp. Ex. 1 | Comp. Ex. 2 |
|---|---|---|---|---|---|---|---|
| Composition | resin A | 100 | 100 | — | — | — | — |
| % by weight | resin B | — | — | 100 | 100 | — | — |
|  | resin C | — | — | — | — | 100 | 100 |
|  | Aronix M 315* | — | — | — | 5 | — | — |
| Application method |  | applicator | electro-deposition | applicator | electro-deposition | applicator | electro-deposition |
| Evaluation | tack | O | O | O | O | X | X |
|  | pencil hardness | H | H | H | H | 4B | 4B |
|  | photo-sensitivity | O | O | O | O | O | O |

*trade name, a product of Toagosei Chemical Industry Co., Ltd. triacryloyloxyethyl isocyanurate (tack test)

A cooper clad laminate having a photosensitive coating formed thereon was put in a dark thermohumidistat at 30° C. A negative mask (made of PET film) having a circuit pattern drawn thereon was put on the coating. A glass plate having a thickness of 1.5 mm and a weight were put on the mask to thereby apply a pressure of 0.2 kg/cm² (corresponding to a pressure applied in case of vacuum adhesion) to the interface between the mask and the coating. This condition was kept for 5 minutes, followed by the removal of the glass plate and the weight. Then, the mask was peeled off to evaluate the peel properties according to the following criteria. In this test, the test apparatus to be used was heated to the temperature of the testing atmosphere prior to its use.

O: the mask was peeled off without making any peel noise and without any resistance.

X: the peeling of the mask gave some resistance and made a distinct peel noise.

(photosensitivity test)

Using an evaluation-purpose circuit pattern mask having 50 μm-wide and 100 μm-wide pattern lines, there were formed pattern lines under the following exposure and development conditions to evaluate the pattern reproducibility by microscopic observation.

O: a pattern was formed

X: no pattern was formed (1) exposure conditions apparatus: UVC-2613 mfd. by Ushio Electric Inc.

light source: metal halide lamp quantity of light: 170 mJ/cm (2) development conditions apparatus: spray equipment made by Nippon Petrochemicals Co. Ltd. (spray pressure: 1.35 kg/cm²)

developer: 1% aqueous sodium carbonate solution temperature of the developing solution: 30° C.

What is claimed is:

1. A process for the preparation of a photocurable resin which comprises the steps of:

1) reacting a conjugated diene polymer or copolymer having a number average molecular weight of 500 to 5000 and vinyl content of at least 50 mole % with an α,β-unsaturated dicarboxylic acid anhydride to obtain an adduct, said adduct containing the acid anhydride group

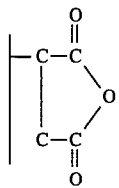

2) reacting said adduct from step 1) with a primary amine of formula $R^1NH_2$     III wherein $R^1$ is a hydrocarbon residue of 1–20 carbon atoms, in the amount of 20–80 mole %, based on said acid anhydride group, whereby an imide is formed containing the group (I) together with two by-products, water and a product containing a succinic acid group in the form of a half-amide according to the reaction hereinbelow

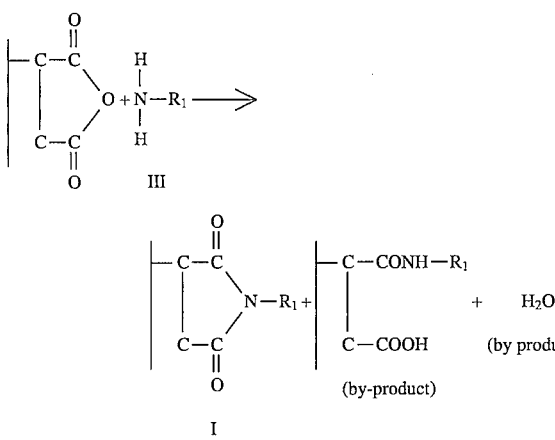

and some of said adduct is unreacted;

3) reacting said water from step 2) with the unreacted adduct to convert said adduct into a product containing the succinic acid group according to the reaction hereinbelow:

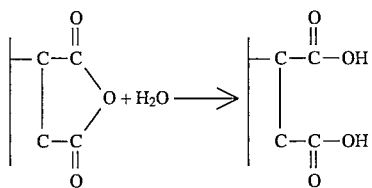

4) Thermally dehydrating said product containing the succinic acid group from step 3) to regenerate said adduct containing the acid anhydride groups according to the reaction hereinbelow:

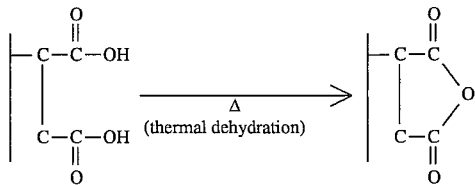

5) and reacting said adduct containing said acid anhydride groups from step 4) with an α,β-unsaturated monocarboxylic acid ester having an alcoholic hydroxyl group of formula (IV) wherein each of $R_2$ and $R_3$ is a hydrogen atom or a methyl group and $R_4$ is a hydrocarbon residue having at least two carbon atoms, to cause ring opening according to the reaction shown hereinbelow:

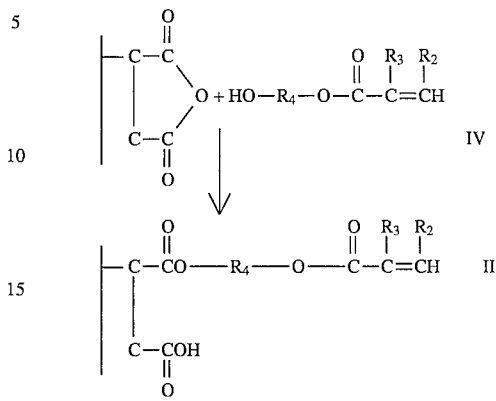

whereby said photocurable resin is obtained containing said product containing the imide group (I) and a product II containing the half-ester group.

2. The process according to claim 1, wherein said steps 2) and 3) are conducted simultaneously.

3. The process according to claim 1, wherein said α,β-unsaturated dicarboxylic acid anhydride in step 1) is maleic anhydride.

4. The process according to claim 1, wherein said α,β-unsaturated monocarboxylic acid ester in step 5) is a member selected from the group consisting of 2-hydroxyethyl acrylate, 2-hydroxyethyl methacrylate, 2-hydroxypropyl acrylate, 2-hydroxypropyl methacrylate, 2-hydroxy-3-phenoxypropyl acrylate and 2-hydroxy-3-phenoxypropyl methacrylate.

5. The process according to claim 1, wherein said conjugated diene in step 1) is butadiene.

6. The process according to claim 1, wherein said primary amine in step 2) is benzylamine.

7. The process according to claim 1, wherein said adduct in step 1) has a softening point between 70° C. and 200° C.

8. The process according to claim 1, wherein said adduct has a half acid number of 50–450 mg KOH/g.

9. The process according to claim 1, wherein the ring opening of said acid anhydride groups in step 5) is carried out to the extent of at least 50 mole % based on the entire amount of said acid anhydride groups remaining after said reaction with said primary amine in step 2).

* * * * *